(12) United States Patent
Magana

(10) Patent No.: US 12,142,549 B2
(45) Date of Patent: Nov. 12, 2024

(54) WAFER STENCIL FOR CONTROLLING DIE ATTACH MATERIAL THICKNESS ON DIE

(71) Applicant: Texas Instruments Incorporated, Dallas, TX (US)

(72) Inventor: Mario Alfonso Eduardo Magana, Sherman, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 307 days.

(21) Appl. No.: 16/026,412

(22) Filed: Jul. 3, 2018

(65) Prior Publication Data

US 2020/0013701 A1   Jan. 9, 2020

(51) Int. Cl.
*H01L 23/495* (2006.01)
*H01L 21/56* (2006.01)
*H01L 23/00* (2006.01)
*B81C 1/00* (2006.01)

(52) U.S. Cl.
CPC ...... *H01L 23/49513* (2013.01); *H01L 21/565* (2013.01); *H01L 23/4951* (2013.01); *H01L 24/27* (2013.01); *B81C 1/00261* (2013.01); *H01L 2224/32221* (2013.01); *H01L 2224/83191* (2013.01)

(58) Field of Classification Search
CPC ............. H01L 21/565; H01L 23/3121; H01L 23/4951; H01L 23/49513; H01L 24/27; H01L 24/83; H01L 24/29
USPC .......................................................... 257/676
See application file for complete search history.

(56) References Cited

U.S. PATENT DOCUMENTS

| 5,289,033 A | * | 2/1994 | Asami ..................... H01L 24/97 257/676 |
| 5,448,450 A | | 9/1995 | Burns |
| 5,614,316 A | * | 3/1997 | Hashimoto ................ C09J 7/35 428/354 |
| 7,279,343 B1 | | 10/2007 | Weaver et al. |
| 2005/0037537 A1 | * | 2/2005 | Kim ........................ H01L 24/06 438/106 |
| 2007/0221325 A1 | * | 9/2007 | Cardoso ................. C09J 201/00 156/322 |

(Continued)

OTHER PUBLICATIONS

Han et al., Wire Sweep Study for SOT Package Array Matrix Molding with Simulation and Experimental Analysis, IEEE 2011 pp. 601-606. (Year: 2011).*

(Continued)

*Primary Examiner* — Brook Kebede
(74) *Attorney, Agent, or Firm* — Ronald O. Neerings; Frank D. Cimino

(57) ABSTRACT

A method of applying a die attach material includes forming a wafer stencil by selectively removing on the back side of a wafer including a plurality of semiconductor die having an active top side a predetermined depth to form a recess having an inner circumference while not removing an outer most circumference of the wafer. The recess is filled with a B-stage adhesive material. The wafer is singulated to form a plurality singulated semiconductor die. The singulated semiconductor die is die attached back side down to a package substrate, and then the B-stage adhesive material is cured. The B-stage adhesive material across its full area generally has a minimum thickness of at least 20 μm and a maximum thickness range of 6 μm.

35 Claims, 3 Drawing Sheets

(56) References Cited

U.S. PATENT DOCUMENTS

2010/0311227 A1* 12/2010 Hatakeyama ..... H01L 21/67132
  438/464
2014/0353772 A1  12/2014 Stermer, Jr. et al.
2015/0294925 A1* 10/2015 Shih ................. H01L 23/49503
  257/676
2015/0340397 A1* 11/2015 Seo ................... H01L 27/14623
  257/432
2016/0260682 A1*  9/2016 Scanlan ................ H01L 21/78

OTHER PUBLICATIONS

Mark Whitmore & Jeff Schake, "Screen and Stencil Printing Processes for Wafer Backside Coating", 2008 33rd IEEE/CPMT International Electronics Manufacturing Technology Conference (IEMT) in Penang, Malaysia, Nov. 4-6, 2008, pp. 1-8, DEK Printing Machines Ltd., Weymouth, Dorset, UK.

* cited by examiner

WAFER STENCIL FOR CONTROLLING DIE ATTACH MATERIAL THICKNESS ON DIE

FIELD

This Disclosure relates to microelectronic packaging and, more particularly to methods of placing die attach material on the back side of a semiconductor die.

BACKGROUND

For packaging a semiconductor die that is generally an integrated circuit (IC), the die is generally mounted on a substrate, where this substrate often referred to as a "package substrate." The package substrate generally includes a plurality of leads that are for electrically coupling with the bond pads of the die, as well as circuitry to route signals to and from the die.

The die is typically attached to the package substrate using an epoxy adhesive. This epoxy forms an "underfill" layer that both attaches the die to the package substrate and provides mechanical support for the die and for the electrical connections (e.g., solder elements) between the die's bond pads and the substrate's leads. To minimize voids in the underfill layer, the adhesive (or "underfill material") is typically deposited on the package substrate in a glob or mound, wherein this glob is dispensed onto the package substrate at a location where the semiconductor die will be attached.

Coating of die attach material to the back side of wafers instead of to the package substrate surface is also known for assembly processing, such as for semiconductor dies when using on Chip on Lead (COL) assembly. For COL assembly, an IC alignment fixture aligns (registers) die on a wafer having on their back side a die attach adhesive that is generally a B-staged epoxy that is applied and controlled in thickness by a stencil to provide adhesive patches which are partially cured. The back side of the semiconductor die having the die attach adhesive is on lead fingers of a lead frame that are part of a lead frame panel (or lead frame sheet). Stencils are generally manufactured by laser cutting and electropolishing. The thickness (or height) dimension of conventional stencils control the adhesive thickness. The wafer is then singulated, individual semiconductor die are then attached to the package substrate aided by the stickiness of the partially cured B-staged epoxy. The B-staged epoxy is then completely cured, followed by molding to generate completed individual packaged devices.

New leadless packages such as Quad Flat No-lead (QFN) packages and small outline transistor (SOT) packages are becoming thinner and thinner. The stencil thickness accuracy is thus becoming more important for backside die attach adhesive coating onto a wafer. A conventional method builds stencils for different packages thicknesses. However, this method increases the cycle time, and there is a significant manufacturing cost of stencils, as well as for adjustment to wafer thickness and for machine set up. Moreover, the accuracy of the stencil thickness has become a challenge.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize wafer removal processes such as a wafer back grind process generally provides a high accuracy (a typical accuracy of ±2 µm, vs. ±10 µm for a stencil) so that the resulting wafer thickness ground into the wafer can provide significantly better thickness accuracy as compared to die attach stencils. Disclosed methods use a wafer removal process such as a wafer back grind, etch or ablation process to form what is referred to herein as a 'wafer stencil" that has an inner circumference on the wafer recessed to a predetermined thickness, while not removing an outermost circumference of the wafer. This selective wafer back side removal leaves a wafer edge comprising a raised ring on the outer most circumference of the wafer that frames an inner recess having a height designed for a later B-stage epoxy layer filling.

The outer raised ring relative to the inner recess allows the raised ring to function as a wafer stencil for back side epoxy coating. Because it is the wafer itself that functions as a wafer stencil, this method solves a current assembly problem that each package type using a B-stage die attach adhesive requires different a stencil thickness depending from specified package thickness. The advantages provided by disclosed wafer stencils include the flexibility to have multiple stencil thickness options configured in a short time, and no additional cost and more accuracy compared to conventional stencils that is particularly helpful for die attach processing for thin packages, such as QFN packages and small outline transistor (SOT) packages.

Disclosed aspects include a method of applying a die attach material that includes forming a disclosed wafer stencil by selectively removing on the back side of a wafer including a plurality of semiconductor die having an active top side a predetermined depth to form a recess having an inner circumference while not removing an outer most circumference of the wafer. The recess is filled with a B-stage adhesive material. The wafer is singulated to form a plurality singulated semiconductor die. The singulated semiconductor die is die attached back side down to a package substrate, and then the B-stage adhesive material is cured. The B-stage adhesive material across its full area generally has a minimum thickness of at least 20 µm and a maximum thickness range of 6 µm which can be compared to a thickness range of 20 µm for a conventional stencil-based process.

BRIEF DESCRIPTION OF THE DRAWINGS

Reference will now be made to the accompanying drawings, which are not necessarily drawn to scale, wherein.

DETAILED DESCRIPTION

Figure 1A:
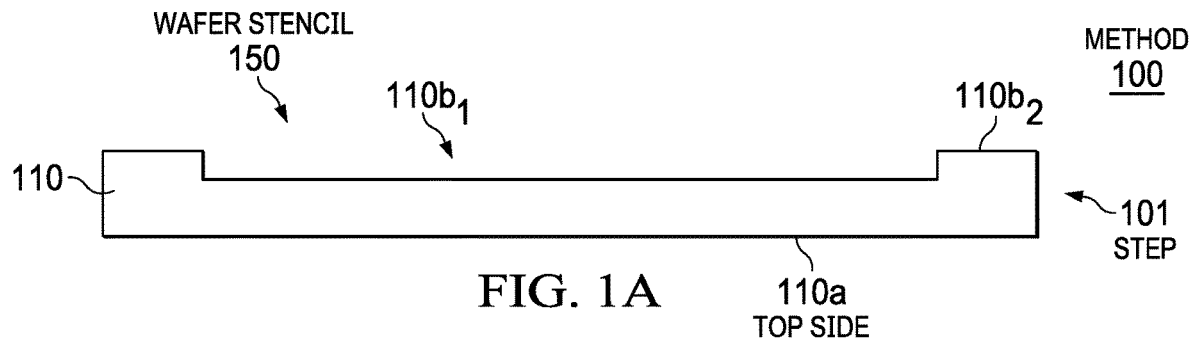
FIGS. 1A-E show successive cross sectional views corresponding to steps in an example method of applying a B-stage die attach material to the back side of a wafer using a disclosed wafer stencil for controlling the die attach thickness, according to an example aspect.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIGS. 1A-E show successive cross sectional views corresponding to steps in an example single-layer method 100 for applying a B-stage adhesive die attach material to the back side of a wafer using a disclosed wafer stencil for controlling the die attach thickness, according to an example aspect. Step 101 comprises forming a wafer stencil 150 by selectively removing wafer material on the back side of a wafer 150 that includes a plurality of semiconductor die having an active top side 110a a predetermined depth to form a recess $110b_1$ having an inner circumference while not removing an outer most circumference $110b_2$ of the wafer which has the appearance of a raised ring. FIG. 1A shows the results after step 101 where the wafer stencil 150 comprising a wafer 110 with a plurality of semiconductor die (individual die not shown, which typically comprise hundreds or thousands of die separated by scribe lines) having an active top side 110a is shown after selectively removing material from a back side of the wafer 110 to form the recess $110b_1$. The wafer 110 can be previously conventionally back ground to about 200 μm, or can be at its original thickness of about 25 mils (635 μm). The semiconductor die can be IC die, or a discrete die such as a power diode, power transistor, or a trench capacitor.

The outer most circumference $110b_2$ can be approximately 1 to 5 mm wide ring, typically 2 to 3 mm corresponding to the edge exclusion zone of the wafer 110. The selectively removing can comprise back grinding, lasering, or dry etching (e.g., reactive ion etching (RIE)) or wet etching, with the etch processing generally utilizing an etch mask to enabling selectively etching. The predetermined depth is set by the depth of the inner recess $110b_1$ that has a depth designed for a later B-stage adhesive layer addition within the recess.

Figure 1B:
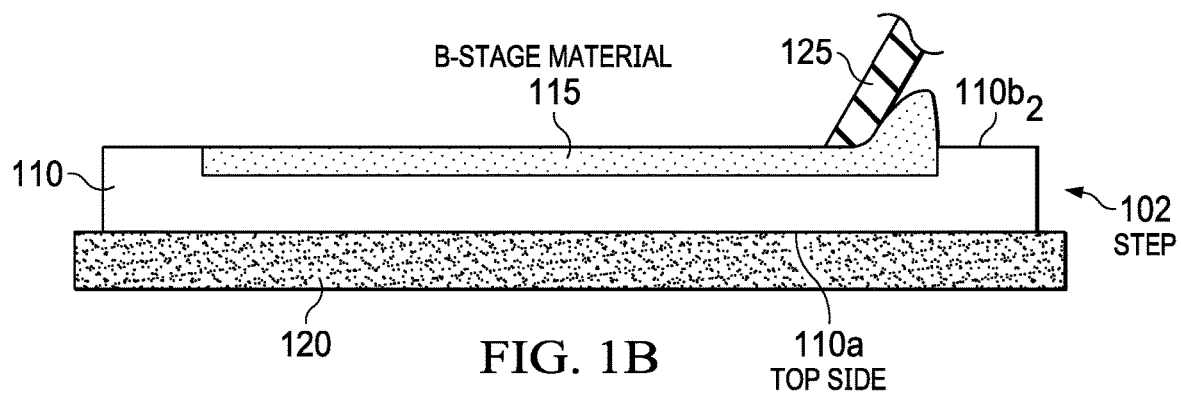

Step 102 comprises filing the inner recess $110b_1$ of the wafer stencil 150 with a B-stage adhesive material. FIG. 1B shows the wafer stencil shown in FIG. 1A now on a vacuum chuck or adhesive tape 120 after the step 102 filling of the inner recess $110b_1$ with a B-stage adhesive material 115, then shaving the B-stage adhesive material 115 with a shaver 125 (or squeegee), shown almost finished cutting the B-stage adhesive material to set the thickness of the B-stage adhesive material as shown to the level of the top surface of the outer most circumference $110b_2$. By leaving a disclosed outer most circumference $110b_2$ on the outer circumference of the wafer 110, wafer warpage is lowered, wafer strength is improved, and the ease of wafer handling is improved. Moreover, the outer most circumference $110b_2$ on the outer circumference of the wafer 110 that provides added mechanical support improves the ease of processing after wafer thinning including dicing tape attach, and back side coating.

Some high performance epoxies are formulated as B-stage systems. As known in polymer chemistry, a B-stage epoxy is a polymer-based system wherein the first reaction between the resin and the curing agent/hardener is purposely not completed. Due to this, the polymer system is in a partially cured stage. When this polymer system is then reheated at elevated temperatures, the polymer cross-linking is completed and the system fully cures.

The B-stage adhesive material 115 comprises a material with good adhesive properties (i.e., is sticky) when it is set but not fully cured (e.g., the first stage), so that it can securely hold a wafer during wafer handling operations and die attachment is thus facilitated. Generally, the B-stage adhesive material 115 should be compatible with both the wafer 110 and the support structure that the singulated dice are intended to be mounted on. By way of example, there are a number of B-stage epoxy compositions that are compatible with and adhere well to the back surface of semiconductor wafers and commonly used support structures that can be used with disclosed aspects.

Figure 1C:
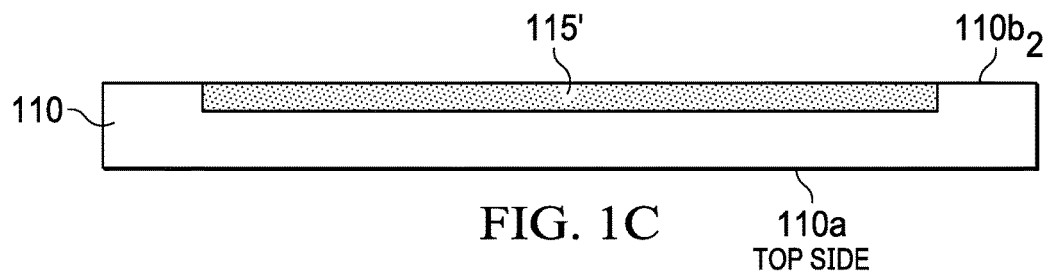

FIG. 1C shows the wafer 110 after shaving is completed and after partially curing the B-stage adhesive material which is now shown as 115'. Although no adhesive shrinkage is shown in FIG. 1C due to the partial curing, there is generally some shrinkage due to the cross-linking involved. The filling of the B-stage adhesive can be to a height that is set so that after the partial cure the known material shrinkage % results in the partially cured B-stage adhesive material 115' being essentially planar, generally within 1 μm, relative to the top surface of the outer most circumference $110b_2$.

Figure 1D:
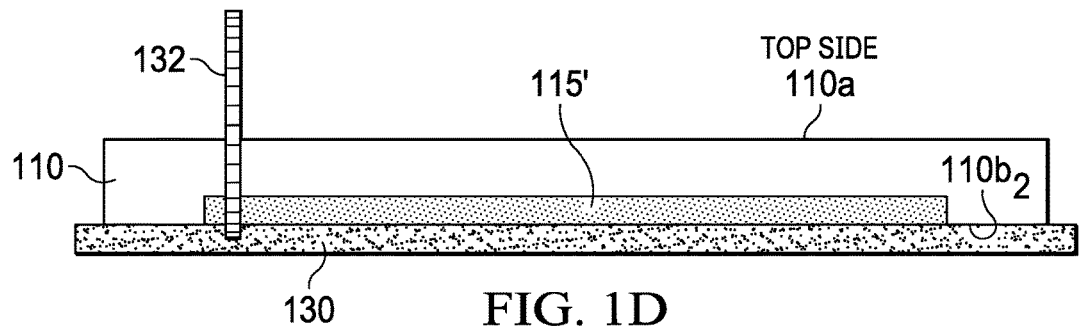
Figure 1E:
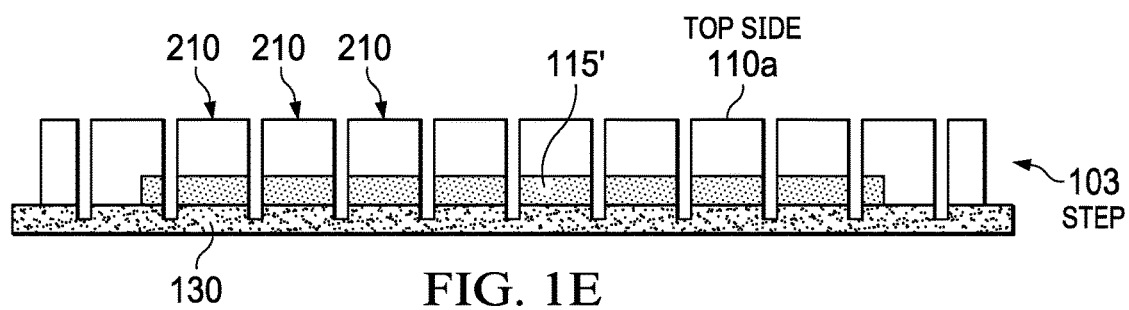

FIG. 1D shows the wafer 110 now attached back side down on a dicing tape 130 with the blade 132 of a mechanical saw shown beginning the singulation process. However, laser singulation may also be used. In step 103 the wafer is singulated to form a plurality singulated semiconductor die. FIG. 1E shows the wafer 110 after step 103 being fully singulated with the semiconductor die shown as 210 separated having their own partially cured B-stage adhesive material 115'. After die attach of the back side of the semiconductor die down to a package substrate, the B-stage adhesive material 115 is then fully cured using a curing process with a higher temperature and generally a longer time as compared to the partial curing process. There is also a small amount of adhesive shrinkage at final cure. The B-stage adhesive material after die attach across its full area has a minimum thickness of at least 20 μm and a maximum thickness range of ±3 μm (6 μm), such as ±2 μm (4 μm). The thickness of the fully cured B-stage adhesive material is typically 20 μm to 60 μm, but can be as thick as nearly the wafer thickness, such as up to about 600 μm.

As known in the art, subsequent processing includes die picking and placing the singulated die on a package substrate, then die attaching the die to the package substrate. The package substrate can comprise a lead frame, a printed circuit board (PCB), another semiconductor die, or generally any other package substrate.

Figure 1F:
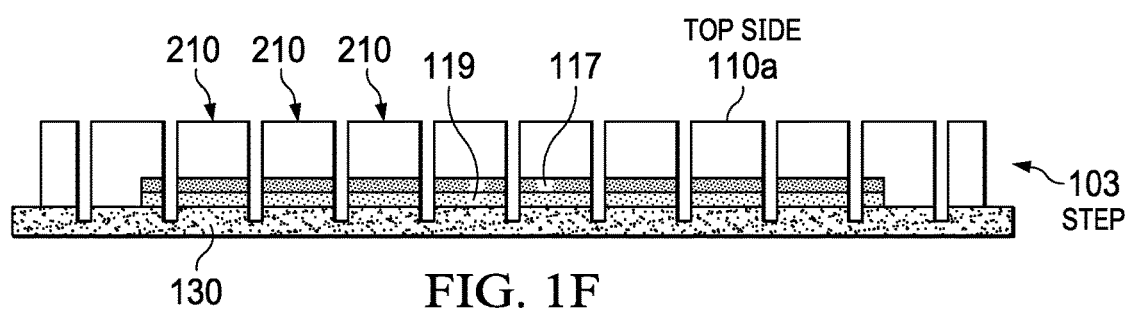
FIG. 1F shows a cross sectional view corresponding to steps in an example method of applying a double-layer B-stage die attach material to the back side of a wafer using a disclosed wafer stencil for controlling the die attach thickness, according to an example aspect.

The process flow can comprise a single B-stage epoxy layer as described above or a double-layer B-stage adhesive process, as shown in FIG. 1F. Plasma processing generally proceeds epoxy printing in either case. In the double-layer process the first B-stage epoxy layer 117 is fully cured and this layer adheres to the back side of the wafer, and there is a second B-stage epoxy layer 119 applied on top of the cured first B-stage epoxy layer which is then partially cured, followed by wafer singulation, die attach to a package substrate, and then fully curing the second B-stage epoxy layer.

Figure 2:
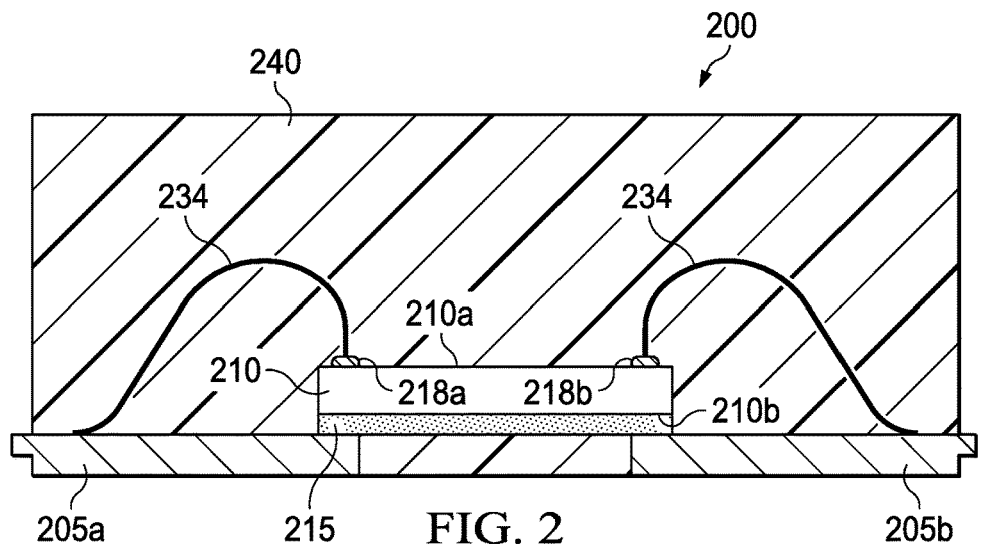
FIG. 2 is a diagram illustrating a cross-section view of a COL QFN packaged semiconductor device that includes a semiconductor die that had the B-stage adhesive die attach in the package formed by a disclosed wafer stencil for controlling the die attach thickness on the back side of the semiconductor die, where the semiconductor die is attached to lead fingers.

FIG. 2 is a diagram illustrating a cross-section view of a COL QFN packaged semiconductor device (QFN package) 200, wherein QFN package 200 includes a semiconductor die 210 that had the fully cured B-stage adhesive material shown as 215 in the package formed by a disclosed wafer stencil for controlling the die attach thickness on the back side of the semiconductor die 210 attached to lead fingers shown as 205a and 205b. The semiconductor die 210 can comprise an IC die, and the active surface 210a includes functional circuitry comprising circuit elements (including transistors, and generally diodes, resistors, capacitors, etc.) formed therein for generally realizing at least circuit function, and an inactive back side surface (inactive surface) 210b. Example circuit functions include analog (e.g., amplifier or power converter), radio frequency (RF), digital, or non-volatile memory functions. The semiconductor die 210 also includes an inactive surface 210b having cured B-stage adhesive material 215 thereon which is utilized to attach the inactive surface 210b of the semiconductor die 210 to the lead fingers shown as 205a and 205b.

Furthermore, on the active surface 210a there is a plurality of bond pads shown as 218a, 218b located at a perimeter of active surface 210a, wherein the bond pad(s) 218a, 218b enable the semiconductor die 210 to be coupled to leads 205a, 205b by one or more wire bonds 234. The semiconductor die 210 may be formed of, for example, silicon, silicon dioxide, germanium, gallium arsenide, and/or similar material(s), and may be, for example, a complementary metal-oxide semiconductor (CMOS) chip, a micro-electromechanical (MEMS) chip, or a similar semiconductor chip.

Wire bonds 234 are typically formed of an electrically conductive material such as copper, gold, silver, platinum, or similar conductive material. Once the semiconductor die 210 is attached to the lead fingers shown as 205a and 205b and wire bonds 234 are added, these components are molded together utilizing mold material 240. Mold material 240 is typically a plastic or similar non-electrically conductive material, and is utilized to protect the semiconductor die 210, the lead fingers 205a and 205b, and the wire bonds 234.

Figure 3:
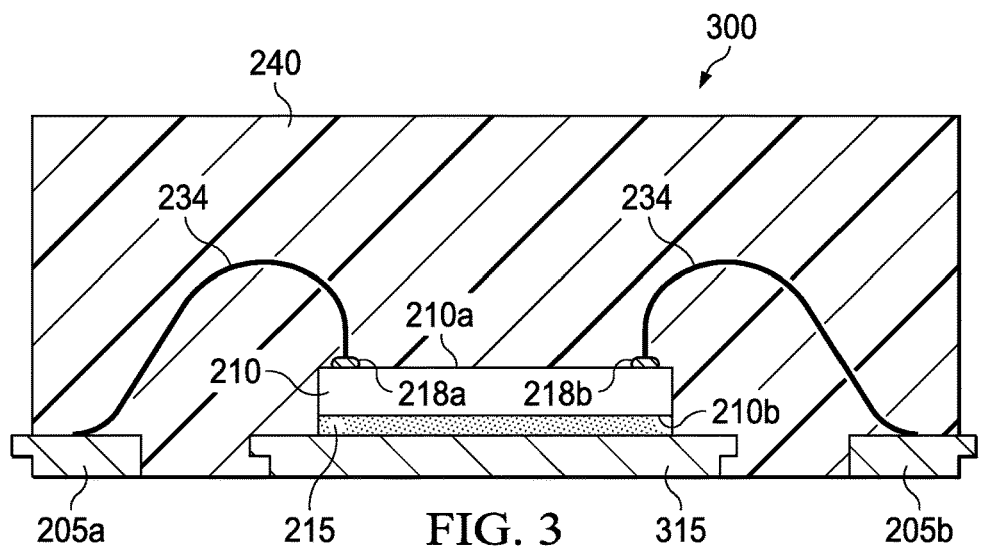
FIG. 3 is a diagram illustrating a cross-section view of a QFN packaged semiconductor device that includes a die pad that includes a semiconductor die that had the B-stage adhesive die attach material in the package formed by a disclosed wafer stencil for controlling the die attach thickness on the back side of the semiconductor die, where the semiconductor die is attached the die pad.

FIG. 3 is a diagram illustrating a cross-section view of a QFN packaged semiconductor device (QFN package) 300 that includes a die pad 315, wherein QFN package 300 includes a semiconductor die 210 having a die pad 315 that includes a semiconductor die that had the cured B-stage adhesive material 215 in the package formed by a disclosed wafer stencil for controlling the die attach thickness on the back side of the semiconductor die attached to the die pad 315. The die pad 315 is typically formed from a conductive material (e.g., a metal) and includes a mold lock utilized to attach the die pad 315 to a mold material 240.

Figure 4:
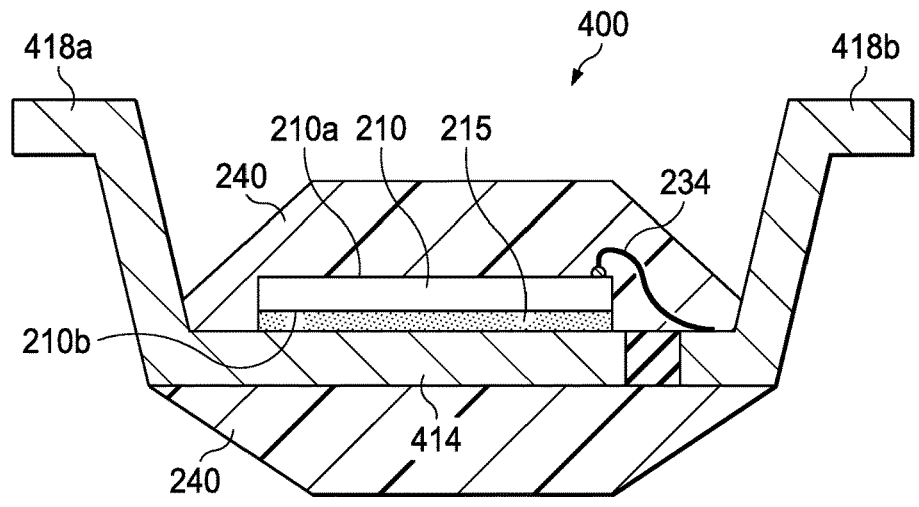
FIG. 4 is a cross section diagram of an SOT QFN packaged semiconductor device that includes a die pad package and a semiconductor die that had the B-stage adhesive die attach material in the package formed by a disclosed wafer stencil for controlling the die attach thickness on the back side of the semiconductor die.

A SOT package is known to be a very small, inexpensive surface-mount plastic-molded packages with leads on their two long sides commonly used for mainly discrete components and simple IC's. FIG. 4 is a cross section diagram of a SOT packaged semiconductor device package (SOT package) 400 that includes a semiconductor die 210 that had the cured B-stage adhesive material 215 in the package formed by a disclosed wafer stencil for controlling the die attach thickness on the back side of the semiconductor die 210. The semiconductor die 210 is affixed to a die attach pad 414 using a disclosed cured B-stage adhesive material 215. The die attach pad 414 is part of a lead frame that includes a plurality of leads 418a, 418b.

In the example shown, lead 418a is connected to the die attach pad 414, whereas the other lead 418b is connected to a bond pad (not visible) on the top or active surface of the die 210 using a bond wire 234. The entire package 400, including the die 210, die attach pad 414, wire bonds 234, and the non-external portions of the leads 418a, 418b, are encapsulated in the mold material 240. Although only two leads 418a and 418b are shown in the cross section, it should be noted that a typical SOT package will have additional leads. For example, a typical Small Outline Package (SOP) package may have several signal leads, input and output leads as well as ground and power supply leads. One lead, here shown as 418a, is used as a ground lead that is directly coupled to the die attach pad 414. By grounding the die attach pad 414, the non-active surface 210b of the die 210 is also grounded, which is improves the electrical operation of the circuitry on the semiconductor die 210.

As noted above, disclosed wafer stencils control the thickness of the die attach B-stage process. This technique eliminates the conventional need to have different stencil thicknesses for each package requirement, and improves wafer warpage issue particularly for very thin wafers during B-stage application and after die attach cure for large wafer diameters, such as having a 300 mm size.

Disclosed embodiments can be integrated into a variety of assembly flows to form a variety of different semiconductor packages and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many other embodiments and variations of embodiments are possible within the scope of the claimed invention, and further additions, deletions, substitutions and modifications may be made to the described embodiments without departing from the scope of this Disclosure.

The invention claimed is:

1. A method, comprising:
   forming a wafer stencil by selectively removing on the back side of a wafer comprising a plurality of semiconductor die having an active top side a predetermined depth to form a recess having an inner circumference while not removing an outer most circumference of the wafer;
   filling the recess with a B-stage adhesive material;
   singulating the wafer to form a plurality of singulated semiconductor die;
   die attaching the singulated semiconductor die back side down to package substrates, and
   curing the B-stage adhesive material.

2. The method of claim 1, wherein the selectively removing comprises back grinding.

3. The method of claim 1, wherein the predetermined depth is 20 μm to 60 μm.

4. The method of claim 1, wherein the outer most circumference of the wafer is 1 mm to 5 mm wide.

5. The method of claim 1, further comprising a partial curing of the B-stage adhesive material before the singulating.

6. The method of claim 1, further comprising a full curing of the B-stage adhesive material before the singulating, and again filling the recess with a second layer of B-stage adhesive material before the singulating.

7. The method of claim 1, wherein the package substrate comprises small outline transistor (SOT) package.

8. The method of claim 7, wherein the lead frames comprise Quad Flat No-Lead (QFN) lead frames.

9. The method of claim 1, wherein the package substrates comprise lead frames.

10. The method of claim 1, wherein the B-stage adhesive material after the curing across its full area has a minimum thickness of at least 20 µm and a maximum thickness range of 6 µm.

11. A semiconductor die, comprising:
an active top side and an inactive back side surface; and
a double-layer B-stage adhesive material across an area of the inactive back side surface, a first portion of the double-layer B-stage adhesive material being fully cured and a second portion of the double-layer B-stage adhesive material being partially cured, wherein the double-layer B-stage adhesive material across the area has a maximum thickness range of 4-6 µm.

12. A semiconductor die, comprising: an active top side and an inactive back side surface; and a double-layer B-stage adhesive material across an area of the inactive back side surface, a first portion of the double-layer B-stage adhesive material being fully cured and a second portion of the double-layer B-stage adhesive material being partially cured, wherein the double-layer B-stage adhesive material comprises an epoxy.

13. A semiconductor die, comprising:
an active top side and an inactive back side surface; and
a B-stage adhesive material across an area of the inactive back side surface, wherein the B-stage adhesive material comprises a fully cured top B-stage adhesive layer on a partially cured bottom B-stage adhesive layer.

14. A packaged semiconductor device, comprising:
a semiconductor die, comprising:
an active top side and an inactive back side surface;
a B-stage adhesive material across an area of the inactive back side surface, wherein the B-stage adhesive material comprises a fully cured top B-stage adhesive layer on a partially cured bottom B-stage adhesive layer; and
a package substrate, wherein the semiconductor die is attached inactive back side surface down on the package substrate via the partially cured bottom B-stage adhesive layer which is fully cured after it is attached to the package substrate.

15. The packaged semiconductor device of claim 14, wherein a thickness of the B-stage adhesive material is 20 µm to 60 µm.

16. The packaged semiconductor device of claim 14, wherein the package substrate comprises small outline transistor (SOT) package.

17. The packaged semiconductor device of claim 14, wherein the package substrate comprises a lead frame.

18. The packaged semiconductor device of claim 17, wherein the lead frame comprises a Quad Flat No-Lead (QFN) lead frame.

19. The packaged semiconductor device of claim 18, wherein the packaged semiconductor device comprises a Chip on Lead (COL) assembly.

20. A semiconductor die, comprising:
an active top side and an inactive back side surface; and
a double-layer B-stage adhesive material across an area of the inactive back side surface, a first portion of the double-layer B-stage adhesive material being fully cured and a second portion of the double-layer B-stage adhesive material being partially cured, wherein the double-layer B-stage adhesive material across the area has a maximum thickness range of 6 µm.

21. A packaged semiconductor device, comprising:
a semiconductor die, comprising:
an active top side and an inactive back side surface;
a B-stage adhesive material across an area of the inactive back side surface, wherein the B-stage adhesive material comprises a top B-stage adhesive layer on a bottom B-stage adhesive layer; and
a package substrate, wherein the semiconductor die is attached inactive back side surface down on the package substrate, wherein the B-stage adhesive material across the area has a maximum thickness range of 6 µm.

22. A semiconductor die, comprising: an active top side and an inactive back side surface; and a double-layer B-stage adhesive material across an area of the inactive back side surface, a first portion of the double-layer B-stage adhesive material being fully cured and a second portion of the double-layer B-stage adhesive material being partially cured, wherein the first portion is a layer across the area of the back side surface and the second portion is a layer across the first portion.

23. A packaged semiconductor device, comprising:
a semiconductor die, comprising:
an active top side and an inactive back side surface;
a B-stage adhesive material across an area of the inactive back side surface, wherein the B-stage adhesive material comprises a top B-stage adhesive layer on a bottom B-stage adhesive layer, wherein one of the top and bottom B-stage adhesive layers is fully cured and the other is partially cured; and
a die pad portion of a lead frame, wherein the semiconductor die is attached inactive back side surface down on the die pad.

24. A semiconductor die, comprising:
an active top side and an inactive back side surface; and
a double-layer B-stage adhesive material across an area of the inactive back side surface, a first portion of the double-layer B-stage adhesive material being fully cured and a second portion of the double-layer B-stage adhesive material being partially cured, wherein the double-layer B-stage adhesive material is attached to the inactive back side surface prior to the semiconductor die being singulated from a wafer.

25. A packaged semiconductor device, comprising:
a semiconductor die, comprising:
an active top side and an inactive back side surface;
a B-stage adhesive material across an area of the inactive back side surface, wherein the B-stage adhesive material comprises a top B-stage adhesive layer on a bottom B-stage adhesive layer; and
a package substrate, wherein the semiconductor die is attached inactive back side surface down on the package substrate, wherein the B-stage adhesive material is attached to the substrate prior to the semiconductor die being singulated from a wafer.

26. A method, comprising:
  removing on the back side of a wafer comprising a plurality of semiconductor die having an active top side a predetermined depth to form a recess having an inner circumference while not removing an outer most circumference of the wafer;
  filling the recess with a B-stage adhesive material;
  singulating a semiconductor die from the wafer;
  die attaching the singulated semiconductor die back side down to a package substrate, and
  curing the B-stage adhesive material.

27. The method of claim 26, wherein the selectively removing comprises back grinding.

28. The method of claim 26, wherein the predetermined depth is 20 µm to 60 µm.

29. The method of claim 26, wherein the outer most circumference of the wafer is 1 mm to 5 mm wide.

30. The method of claim 26, further comprising a partial curing of the B-stage adhesive material before the singulating.

31. The method of claim 26, further comprising a full curing of the B-stage adhesive material before the singulating, and again filling the recess with a second layer of B-stage adhesive material before the singulating.

32. The method of claim 26, wherein the package substrate comprises small outline transistor (SOT) package.

33. The method of claim 26, wherein the package substrate comprises a lead frame.

34. The method of claim 32, wherein the lead frame comprises a Quad Flat No-Lead (QFN) lead frame.

35. The method of claim 26, wherein the B-stage adhesive material after the curing across its full area has a minimum thickness of at least 20 µm and a maximum thickness range of 6 µm.

* * * * *